(12) United States Patent
Schouhamer Immink

(10) Patent No.: US 7,372,376 B2
(45) Date of Patent: May 13, 2008

(54) SYSTEM OF CONVERTING INFORMATION WORDS TO A SIGNAL

(75) Inventor: Kornelis Antonie Schouhamer Immink, Rotterdam (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 789 days.

(21) Appl. No.: 10/502,174

(22) PCT Filed: Dec. 18, 2002

(86) PCT No.: PCT/IB02/05604

§ 371 (c)(1),
(2), (4) Date: Jul. 21, 2004

(87) PCT Pub. No.: WO03/063358

PCT Pub. Date: Jul. 31, 2003

(65) Prior Publication Data

US 2006/0235916 A1    Oct. 19, 2006

(30) Foreign Application Priority Data

Jan. 23, 2002   (EP) .................................. 02075275

(51) Int. Cl.
*H03M 7/00* (2006.01)

(52) U.S. Cl. .......................................... 341/59; 341/55
(58) Field of Classification Search ............. 341/50–70
See application file for complete search history.

(56) References Cited

U.S. PATENT DOCUMENTS

| 5,790,056 | A * | 8/1998 | Schouhamer Immink .... 341/58 |
| 6,225,921 | B1 * | 5/2001 | Kahlman et al. ............. 341/58 |
| 6,768,432 | B2 * | 7/2004 | Schouhamer Immink ... 341/102 |
| 7,158,060 | B2 * | 1/2007 | Kahlman et al. ............. 341/67 |

* cited by examiner

*Primary Examiner*—Lam T. Mai

(57) ABSTRACT

A method of converting m-bit information words to a run-length constrained modulated signal includes converting the information words into n-bit code words. The available code words are distributed over at least one group (G1) of a first type and at least one group (G2) of a second type. The selection of a code word belonging to the group of the first or second type establishes a coding state of the first type (S1) or one of a number r of coding states (S2, S3) of the second type, depending on the current information word. For each information word, a subset of code words is available, this subset having at least one disjunct code word for each of the r coding states. The selection from the subset of the code word to be delivered is based the coding state, on dynamically verifying the run-length constraint for the sequence of code words, and on an additional criterion, like the low frequency content of the modulated signal.

18 Claims, 15 Drawing Sheets

| Data | S2 | NS | S3 | NS | S2 | NS | S3 | NS | S2 | NS | S3 | NS |
|---|---|---|---|---|---|---|---|---|---|---|---|---|
| 0 | 010000010010000 | 2 | 001000000001001 | x | 000000100100000000 | x | 010010000100100 | 2 | | | | |
| 1 | 100100000000010 | x | 100000100100000 | 3 | 000010010000000000 | x | 010010000100100 | 3 | | | | |
| 2 | 001000010010000 | 2 | 100000000010010 | x | 000100100000000000 | x | 010010000001001 | x | | | | |
| 3 | 010010010000000 | x | 000000010010000 | 2 | 010010000000001 | x | 100000100000000 | x | 000000100100000000 | x | | |
| 4 | 001000010010000 | 2 | 100000100100000 | x | 010010000000010 | x | 100000000010000 | 3 | 000000010010000000 | 3 | | |
| 5 | 001000000010100 | 2 | 100100100000000 | x | 010010000000000 | x | 100100000010100 | 3 | 000000010010000000 | 3 | 000000001001000 | 3 |
| 6 | 001000000100100 | 3 | 100100000000000 | x | 010010000000100 | 2 | 100100000010000 | 3 | | | 000000001001000 | 2 |
| 7 | 010000000010010 | x | 001000000001000 | 3 | 010000010000000 | x | 100100000000100 | 2 | | | | |
| 8 | 001000010010000 | 3 | 100001001000000 | x | 010010010010000 | 3 | 100100000100100 | 3 | 000000010010000 | 2 | | |
| 9 | 001000100100000 | 3 | 100100100000001 | x | 010010000100100 | 2 | 100100000100100 | 2 | 000000100100000 | 2 | | |
| 10 | 100100010010000 | x | 100010010000000 | x | 000000100100000 | x | 100100100010000 | x | | | | |
| 11 | 001100100100000 | x | 100000010010000 | 3 | 000100100100000 | x | 100100001001000 | 3 | | | | |
| 12 | 001001100100000 | x | 000000010010000 | 2 | 000100100100000 | x | 010001001001000 | 3 | | | | |
| 13 | 001001001000000 | x | 000010010000001 | x | 001000100100000 | x | 100010000000100 | 3 | | | | |
| 14 | 010000000100100 | 3 | 001000000101001 | x | 010010000000100 | 3 | 100100010010000 | 3 | 000010010010000 | 3 | 000000001000100 | 3 |
| 15 | 001000010010000 | x | 100000100100001 | x | 010010000010000 | 2 | 100100100100000 | 3 | 000000010010000 | 3 | | |
| 16 | 001000001001001 | x | 100000100100001 | x | 010000010010000 | x | 100100000100000 | x | | | | |
| 17 | 010000000100100 | x | 000100100100010 | x | 010010000001000 | x | 010010000100100 | 3 | 000000010010010 | 3 | | |
| 18 | 010000000100100 | x | 000000001001001 | x | 010010000100100 | x | 100100100010000 | 2 | 000000100100100 | 2 | | |
| 19 | 001000000010010 | x | 000100010000000 | x | 010010100100000 | x | 100010010100000 | 3 | | | | |
| 20 | 001000000100100 | x | 100010010100000 | x | 010010010100000 | 2 | 010010000100100 | 2 | 000000010010000 | 2 | 000000001000100 | 2 |
| 21 | 010000000000010 | x | 010000000010001 | x | 010010000010010 | x | 010010000100100 | x | 000000100100100 | 2 | | |
| 22 | 000010010000001 | x | 100001001100000 | x | 000010010000001 | x | 100010000100100 | 3 | | | | |
| 23 | 001000100000100 | 2 | 100000010010000 | 2 | 000010010000001 | x | 100010010010000 | 3 | | | | |
| 24 | 100001000000100 | 2 | 100000001001000 | 3 | 000100100000001 | x | 100100000010000 | 2 | | | | |
| 25 | 010000000010010 | 2 | 100000000100100 | 2 | 001000100100000 | x | 010010100010000 | 2 | | | | |
| 26 | 001000100100000 | 2 | 100001000000010 | x | 010010000000100 | 3 | 100010000000100 | 2 | | | 000000001001001 | x |
| 27 | 000100001001000 | 2 | 100001000010001 | x | 010000010000001 | x | 100010001000010 | x | 000000010010001 | x | | |

FIG.7a

| | | | | |
|---|---|---|---|---|
| 28 | 010000010010000 3 | 0010000000010000 2 | 0100010000000100 2 | 1001000000010001 x | |
| 29 | 0001000010010000 2 | 1001001000010010 x | 0100001000000010 x | 1001000000010010 x | 0000000100100001 x |
| 30 | 0100000100100000 3 | 0001000010010000 2 | 0000100001000000 x | 1000100000100100 2 | 0000000100101000001 x |
| 31 | 1000100000100100 2 | 1001000100000001 x | 0001000100000000 x | 1000100000100100 2 | |
| 32 | 0001000000000100 2 | 1000100100000010 x | 0010000100000000 x | 0100001000000001 x | |
| 33 | 0001000000000100 3 | 1000010000000001 x | 0000001000100000 3 | 0100100000010001 x | |
| 34 | 0001000001001000 3 | 1000000000100000 x | 0100010000010010 x | 1000100100100000 3 | 0000001000010000 3 |
| 35 | 0100001001010000 x | 0000100001001000 3 | 0100100000010001 x | 1000100000001000 3 | |
| 36 | 0001000010010000 3 | 1000100000100100 3 | 0100000010000000 x | 1000010000100100 3 | 0000001010000100 3 |
| 37 | 0001001001001000 3 | 1000001000010000 x | 0000010000000001 x | 1000001000000001 x | |
| 38 | 0100100100100000 x | 0010000000001000 3 | 0100010000100100 2 | 1000100010010000 2 | 0000000010000100 2 |
| 39 | 0010000010010000 3 | 1001010010000000 x | 0010000010001000 x | 1001001000100000 3 | |
| 40 | 0010000101000001 x | 0010001001010000 3 | 0100100000010010 x | 1000100000001000 3 | 0000001000010000 2 |
| 41 | 1000001010010000 3 | 1000001010000100 x | 0000001000101000 x | 1000010000000010 x | |
| 42 | 0010010010100000 3 | 1000010001000000 x | 0000010011000010 2 | 1000000010000000 x | |
| 43 | 0010100100001000 x | 1000010010000000 x | 0000010000100001 x | 1000000010001000 2 | |
| 44 | 0001000100010000 x | 1000010010000000 x | 0000010010000010 x | 1000010000000001 x | |
| 45 | 0100100001000000 x | 1000010100010000 x | 0001000100000001 x | 1000100010010000 3 | 0000010000000001 x |
| 46 | 0010010010010000 x | 1000010100100000 x | 0001001010000001 x | 1000100100010000 3 | |
| 47 | 0100100100010000 x | 0010100100010001 x | 0010010000100000 x | 1000100000000010 x | |
| 48 | 0010010010010000 x | 0010100100010001 x | 0010100100010001 x | 0100010000001000 3 | |
| 49 | 0010100100101000 2 | 0100000001001000 3 | 0100100100010001 2 | 1001000010010001 x | 0000001010001001 x |
| 50 | 0100100100001000 3 | 0001000100101001 x | 0100100010010000 3 | 1001000000010001 x | |
| 51 | 0101001001001000 x | 0010000010010000 x | 0100100100010001 x | 1001000010010001 x | 0000010010010010 x |
| 52 | 0010100010010000 x | 1000001001010010 x | 0100100010010001 x | 1001000010010001 x | 0000000100100001 x |
| 53 | 0010100001001000 x | 1000001010001000 x | 0100100010010001 x | 1001001010010001 x | 0000000100100010 x |
| 54 | 0010000010001000 x | 1000001010010000 x | 0101001001010010 x | 1001001010010001 x | 0000010010000001 x |
| 55 | 0010000010001000 x | 1000010010001001 x | 0100100100010010 x | 0100100010001000 3 | 0000010010000010 x |
| 56 | 0010010000100001 x | 1000001010010000 x | 0010100000001000 x | 1001001000100000 3 | |

| | | | |
|---|---|---|---|
| 115 | 000100000100001 | x | 100100100100010001 | x |
| 116 | 000010010010001 | x | 100100010010010 | x |
| 117 | 000010000010001 | x | 100100100001001 | x |
| 118 | 010010010001001 | x | 000010001001001 | x |
| 119 | 000010000100010 | x | 100100100100100 | 2 |
| 120 | 000010000010001 | x | 100100100000100 | 2 |
| 121 | 010000100100010 | x | 000010000001001 | x |
| 122 | 000010100000010 | x | 100100000100000 | 2 |
| 123 | 001001001000100 | 2 | 100100010000100 | 2 |
| 124 | 001001000010001 | 2 | 100000100010000 | 2 |
| 125 | 010000100100001 | x | 001000100000100 | 2 |
| 126 | 001000100100100 | 2 | 100000100100010 | 2 |
| 127 | 010000100100100 | x | 000100001000010 | 2 |
| 128 | 001000100100100 | 2 | 100000100001000 | 2 |
| 129 | 010000100001001 | 2 | 000100001001000 | 2 |
| 130 | 001000001000100 | 2 | 100000100100100 | 3 |
| 131 | 001000000100000 | 2 | 100100010000000100 | 3 |
| 132 | 001001000010000 | 2 | 100100100100100 | 3 |
| 133 | 010000001001000 | x | 000100000001000 | 2 |
| 134 | 000100000010000 | 2 | 100100000100000 | 3 |
| 135 | 000100000010000 | 2 | 100100100010000 | 3 |
| 136 | 000010010010000 | 2 | 100010000010000 | 3 |
| 137 | 000010000010000 | 2 | 100000100010000 | 2 |
| 138 | 010100000010000 | x | 000010001001000 | 2 |
| 139 | 000010001000000 | 2 | 100000100000000 | 3 |
| 140 | 000100010000100 | 2 | 100100010000010 | x |
| 141 | 000010100000100 | 2 | 100000010000100 | 2 |
| 142 | 000010000000100 | 2 | 100000101001000 | 3 |
| 143 | 000010000100100 | 3 | 100000001000100 | 3 |

FIG.7e

| # | | | | |
|---|---|---|---|---|
| 144 | 010000000100001000 2 | 000000100001001000 3 | | |
| 145 | 000001001001000000 3 | 100100001000000 x | | |
| 146 | 010100000000010000 2 | 000010000001000 2 | | |
| 147 | 000010000010001000 3 | 100000000100000 2 | | |
| 148 | 010010000100000100 3 | 000010010001000 3 | | |
| 149 | 000001001000010000 3 | 100000000100000 3 | | |
| 150 | 000100100000010000 3 | 010000100001000 3 | | |
| 151 | 000100100010000000 3 | 100000001000000 x | | |
| 152 | 010000100000010000 3 | 000100010001000 3 | | |
| 153 | 000010010000010000 3 | 100100000100001 x | | |
| 154 | 001000010100000000 3 | 010000010001000 2 | | |
| 155 | 001100000000000100 3 | 100010010001000 3 | | |
| 156 | 001100010000000100 3 | 100010010100010 x | | |
| 157 | 010100000000100001 x | 000100100001000 3 | | |
| 158 | 001000100100000100 3 | 100100100000100 3 | 0100100100000000 x | |
| 159 | 001001000010000100 3 | 100100100001000 2 | | |
| 160 | 001001000100000100 2 | 100100100001000 2 | | |
| 161 | 010000000000010000 3 | 100010000100001 x | 000000100001010 x | |
| 162 | 010010010010001000 2 | 100010010010010 x | 0000001000001001 x | |
| 163 | 010010010010000100 3 | 100010001000100 x | 000000100000010 x | |
| 164 | 010010010100000010 x | 100010010000010 3 | 000000001000001 x | |
| 165 | 001010010000010001 x | 100100100000100 2 | | |
| 166 | 001010010000000010 2 | 100100100000100 2 | | |
| 167 | 010100010000001000 x | 001001000100001 3 | | |
| 168 | 001010000000000100 x | 100100100000001 x | | |
| 169 | 001010000000000010 x | 100000010010010 x | | |
| 170 | 001010000100000000 3 | 100001001010001 x | | |
| 171 | 010010000010000000 x | 001000100010001 x | | |
| 172 | 001010000010000001 x | 100000010001001 x | | |

FIG.7f

| | | | | |
|---|---|---|---|---|
| 173 | 000100100010010 x | 100001000010010 x | | |
| 174 | 000100100000100101 x | 100001000001001 x | | |
| 175 | 000100010000100010 x | 100000010000100010 x | | |
| 176 | 000100010000010010 x | 100001000001001 x | | |
| 177 | 010010001000010 x | 000100100101001 x | | |
| 178 | 000100000100001 x | 100001000001001 x | | |
| 179 | 000010010100010 x | 000010001000001 x | | |
| 180 | 000010010000100 x | 010010001000001 x | | |
| 181 | 010010010000010 2 | 000010010000010 x | | |
| 182 | 000010001000100 x | 010010010000010 x | | |
| 183 | 000010010000010 x | 010010001010010 x | | |
| 184 | 010010010000100 3 | 000001001001010 x | | |
| 185 | 000001100010001 x | 100100000100000 2 | | |
| 186 | 000010010010001 x | 100010010010000 2 | | |
| 187 | 000010001000010 x | 100010010000010 2 | | |
| 188 | 010010010000001 x | 000010010001010 2 | | |
| 189 | 000001000001001 x | 100100000100000 2 | | |
| 190 | 010010010000100 2 | 100010010010000 2 | | |
| 191 | 010010010000010 2 | 100010010001010 2 | | 000000100100100 2 |
| 192 | 010010010000100 2 | 100010010000100 2 | 000000100100100 2 | |
| 193 | 010010010000010 3 | 100010010000100 2 | 000000100000100 2 | |
| 194 | 001010010001000 2 | 001010010010010 2 | | |
| 195 | 010010010010010 x | 100010010000100 2 | | |
| 196 | 001010010010100 2 | 001010010010010 x | | |
| 197 | 001010010000010 2 | 100000010001010 2 | | |
| 198 | 010010001001000 2 | 001010010010100 2 | | |
| 199 | 000100100001000 2 | 010010010001000 2 | | |
| 200 | 000100100001000 3 | 100100100001000 2 | | 000000100100100 2 |
| 201 | 000100100001000 2 | 100100100001000 3 | | |

FIG.7g

| # | Col A | | Col B | | Col C | Col D | Col E |
|---|---|---|---|---|---|---|---|
| 202 | 01000100001000001 | x | 000100100000010000 | 2 | | | |
| 203 | 00010000001000000 | 2 | 10001000100001000 | 3 | | | |
| 204 | 00001000010000100 | 2 | 10000100100001000 | 3 | | | |
| 205 | 00000100001000010 | 2 | 10000100100001000 | 3 | | | |
| 206 | 01000001000100001 | x | 00001001000010000 | 2 | | | |
| 207 | 01000010000100001 | x | 00000100100001000 | 2 | | | |
| 208 | 00000100001000100 | 2 | 10010001001000100 | 3 | | | |
| 209 | 01000100010001000 | x | 00000100000001000 | 2 | | | |
| 210 | 01000001000100010 | x | 10000100000001000 | 3 | | | |
| 211 | 01000001001000100 | 2 | 10000010010001000 | 3 | | | |
| 212 | 01000001000100100 | 2 | 10000010010001000 | 3 | | | 0000000100000100 3 |
| 213 | 01000000001000001 | x | 00000100000001000 | 3 | | | 0000000100010100 3 |
| 214 | 00000100001000100 | 3 | 01000001000001000 | 3 | | | |
| 215 | 01000000000100000 | 2 | 00000010010001000 | 3 | | | |
| 216 | 00000100000010000 | 3 | 10001001000010000 | 3 | | | |
| 217 | 00001000100000010 | 3 | 00001001000001000 | 3 | | | |
| 218 | 01000001000100100 | 3 | 00000100100001001 | x | | | |
| 219 | 00010001000000100 | 3 | 10001001000001000 | 2 | | | |
| 220 | 00010001000001000 | 3 | 10010001000001000 | 2 | | | |
| 221 | 00010001001000100 | 3 | 10010001000001000 | 2 | | | |
| 222 | 01000010001000100 | 3 | 00010010001000000 | 3 | | | |
| 223 | 00010001001000100 | 3 | 10010001000001000 | 3 | | | |
| 224 | 00100010000010000 | 3 | 10001000000010000 | x | | | |
| 225 | 00100001001000100 | 3 | 10010010001000010 | 3 | | | |
| 226 | 01000010001001000 | 3 | 00100010010010000 | x | | | |
| 227 | 01001001000001000 | 3 | 00100100000001000 | 3 | | | |
| 228 | 00100010000100100 | 3 | 10010000100001000 | 3 | | | |
| 229 | 01000010000100000 | 3 | 00100000001001000 | 3 | | | |
| 230 | 00100000001000000 | x | 10010010001000010 | x | | | |

FIG.7h

| | | | | | |
|---|---|---|---|---|---|
| 231 | 0100100110010010 x | 1001100100100010 x | | | 0000001001001001 x |
| 232 | 0100100010000100 2 | 1001100100010001 x | | | |
| 233 | 0100100000010000 2 | 1001100010010010 x | 0000001001000010 x | | |
| 234 | 0100000001000000 x | 1001100010010001 x | 0000001000010001 x | | 0000001000001001 x |
| 235 | 0100100100010001 x | 1001100001000010 x | 0000000100010010 x | | |
| 236 | 0100100100010010 x | 1001000001000001 x | 0000000010000010 x | | |
| 237 | 0100100001000010 x | 1000100100100001 x | 0000000001000001 x | | |
| 238 | 0010010100000010 x | 1000100010010001 x | | | |
| 239 | 0010010001000010 x | 1000100001000010 3 | | | |
| 240 | 0100100100010001 3 | 0010010100000001 x | | | |
| 241 | 0100100100000001 x | 1001000010000100 2 | | | |
| 242 | 0010010100010010 x | 1000000010000000 x | | | |
| 243 | 0010010010000010 x | 1000100001001001 x | | | |
| 244 | 0100100001000001 x | 0001001010001001 x | | | |
| 245 | 0010010001000001 x | 1000100001000010 x | | | |
| 246 | 0000100100100010 x | 1000100100000100 x | | | |
| 247 | 0010010001000010 x | 1000010000010010 x | | | |
| 248 | 0100100100010001 x | 0000100100010001 x | | | |
| 249 | 0000010001000001 x | 1000010000001001 x | | | |
| 250 | 0000010010010010 x | 1000001010000010 x | | | 0000001001000100 2 |
| 251 | 0000010001000010 x | 1000000100000001 x | | | |
| 252 | 0100010010000010 x | 1000000100001001 x | | | |
| 253 | 0000010010000010 x | 0100010001000001 x | | | |
| 254 | 0100010000010001 x | 1001100000010000 2 | | | |
| 255 | 0100010001000010 x | 1000100100000000 2 | | | 0000001000001000 2 |

SYSTEM OF CONVERTING INFORMATION WORDS TO A SIGNAL

The invention relates to a method of converting a series of m-bit information words to a modulated signal, with m being an integer, in which method an n-bit code word is delivered for each received information word, with n being an integer exceeding m, and the delivered code words are modulated to the modulated signal, and in which the series of information words is converted to a series of code words so that the corresponding modulated signal satisfies a predetermined criterion, and in which the code words are spread over at least a group of a first type and at least a group of a second type, while the delivery of a code word belonging to the group of the first type establishes a coding state of a first type determined by the associated group, and the delivery of a code word belonging to the group of the second type establishes one of r coding states of a second type determined by the associated group ánd by the information word associated to the delivered code word, in which the group of the second type comprises at least one code word being associated with at most r information words among which the respective information word is distinguishable by evaluating a predetermined parameter of the following code word.

The invention further relates to a method for producing a record carrier on which a signal is recorded obtained according to said method.

The invention further relates to a coding device comprising an m-to-n bit converter for converting the m-bit information words to n-bit code words, and means for modulating the n-bit code words to a modulated signal, the modulated signal satisfying a predetermined criterion, and state establishing means for establishing, on the delivery of a code word by the converter, a coding state of a first type for each of the delivered code words belonging to a group of a first type determined by the associated group, and one of r coding states of a second type for each of the delivered code words belonging to a group of the second type determined by the associated group ánd by the information word associated to the delivered code word, in which the group of the second type comprises at least one code word being associated with at most r information words among which the respective information word is distinguishable by evaluating a predetermined parameter of the following code word.

The invention further relates to a signal comprising a sequence of successive signal portions each corresponding to an information word, the signal satisfying a predetermined criterion, in which signal each of the signal portions comprises n bit cells having a first or second signal value, a signal portion belonging to a group of a first type of signal portions uniquely representing an information word, and a signal portion belonging to a group of a second type of signal portions in combination with a successive signal portion representing a unique information word, at least one signal portion of the group of the second type being associated with at most r information words among which the respective information word is distinguishable by evaluating a predetermined parameter of the successive signal portion.

The invention further relates to a record carrier on which the signal is recorded.

The invention further relates to a rendering device comprising means for reading information from a track on a record carrier, which device comprises means for scanning the track and demodulation means for retrieving code words from signal portions of a signal provided in the track, the signal satisfying a predetermined criterion, in which signal each of the signal portions comprises n bit cells having a first or second signal value, a signal portion belonging to a group of a first type of signal portions uniquely representing an information word, and a signal portion belonging to a group of a second type of signal portions in combination with a successive signal portion representing a unique information word, and a converter for converting the code words into information words, the converter comprising means for distinguishing the respective information word by evaluating a predetermined parameter of the following code word.

Such methods, such devices, such a record carrier and such a signal are known from U.S. Pat. No. 5,790,056. The document relates to a method of converting a series of m-bit information words to a modulated signal, the method being called EFM+ and being used for encoding data on optical discs like DVD. For each information word from the series an n-bit code word is delivered. The delivered code words are converted to a modulated signal. The code words are distributed over at least one group of a first type and at least one group of a second type. For the delivery of each of the code words belonging to the group of the first type the associated group establishes a coding state of the first type. When a code word belonging to the group of the second type is delivered, a coding state of the second type is established. A code word is assigned to the received information word selected from a set of code words which depends on the established coding state. The sets of code words belonging to the coding states of the second type are disjunct. The selected one of the possible coding sets of the second type is determined by the information word associated to the delivered code word. This allows several information words being associated with the same code word, the established coding state being different. In this coding method the number of unique bit combinations that may be used by the code words in the series is enlarged, thereby increasing the coding efficiency. The modulated signal thus obtained, stored and/or transmitted can be reconverted to information words by first converting the modulated signal to a series of code words and then assigning an information word to each of the code words from the series in dependence on the code word to be converted and also in dependence on a parameter of the following code word, e.g. values of bits which are situated at predetermined positions relative to the current code word, which logical values are indicative for the previously established coding state.

Low frequency components of the modulated signal should be constrained to a low level, in particular DC is to be avoided. The main reason is that low frequency components may interfere with other signals, such as servo tracking signals for controlling the position of the optical head in a direction transverse to the track. To make DC control possible, the described coding system has partial double tables with opposite DC contribution and allows further selection of an alternative code word in the event that a code word from a coding set of the first type is selected, provided that the predetermined criterion of the modulated signal, i.e. the runlength constraints for minimum and maximum runlength of bit cells having the same signal value, is not violated. Although the described converting method results in a modulated signal with limited low frequency content, there still is a need to decrease the low frequency components or to otherwise control the properties of the modulated signal.

Therefore it is an object of the invention to provide means for converting adapted for improved control of the properties of the modulated signal.

According to a first aspect of the invention this object is achieved with a method as in the opening paragraph, characterized in that each information word is provided with an associated subset of code words comprising at least r code words mutually differing in the value of the predetermined parameter, and the delivered code word is selected based on an additional criterion from the subset of code words excluding all code words not complying with said predetermined criterion and, in the event that a coding state of the second type has been established by the preceding code word, excluding all code words having a value of the predetermined parameter not corresponding to the established coding state of the second type.

According to a second aspect of the invention this object is achieved with a coding device as in the opening paragraph, characterized in that the m-to-n-bit converter comprises means for providing for each information word an associated subset of code words comprising at least r second type of code words mutually differing in a predetermined way, and means for selecting a code word based on an additional criterion from the subset of code words excluding all code words not complying with said predetermined criterion and, in the event that a coding state of the second type has been established by the preceding code word, excluding all code words having a value of the predetermined parameter not corresponding to the established coding state of the second type.

According to a third aspect of the invention this object is achieved with a signal as in the opening paragraph, characterized in that the signal comprises at least one signal portion selected based on an additional criterion from a subset of signal portions excluding all signal portions not complying with said predetermined criterion and, in the event that the preceding signal portion belongs to the group of the second type, excluding all signal portions having a value of the predetermined parameter not being associated with the respective information word, and the subset being associated to an information word and comprising at least r signal portions mutually differing in the value of the predetermined parameter.

According to a fourth aspect of the invention this object is achieved with a rendering device as in the opening paragraph, characterized in that the converter comprises means for converting a code word selected from a subset of code words, the subset being associated to the information word and comprising at least r code words mutually differing in the value of the predetermined parameter.

The invention is based on the following recognition. Conventionally the code words are generated using a finite state machine approach, and the code words for each coding state are defined in a set, e.g. like a column in a memory table. When a code word must be selected according to the established coding state, the entry in the table corresponding to the row of the information word and the column of the coding state is accessed. The compliance with the predetermined criterion, i.e. the runlength constraints of the signal, is guaranteed by strict conditions on the code words in each column. The inventor has seen that although in the known coding system always a code word is available, this is not necessarily the best choice. Hence now code words are no longer considered to be part of a set corresponding to a state. For each information word a subset of code words is available from which a best choice is made as follows. First the runlength criterion is dynamically evaluated by excluding all code words not complying with the runlength constraints, and secondly, in the event of a second type coding state, all code words are excluded which do not have the required value of the parameter corresponding to the actual second type coding state. Finally, if more than one code word of the subset complies with the criteria just named, a further choice can be made based on an additional criterion, e.g. the low frequency content of the signal. Surprisingly a further improvement of the low frequency suppression of about 3 dB has been found when comparing the modulated signal according to the invention with the traditional DVD EFM+ coding system as described above.

Further preferred embodiments of the method, devices and record carrier according to the invention are given in the further claims.

These and other aspects of the invention will be apparent from and elucidated further with reference to the embodiments described by way of example in the following description and with reference to the accompanying drawings, in which FIG. 1 shows a series of information words, a corresponding series of code words and a modulated signal;

Figure 7C:
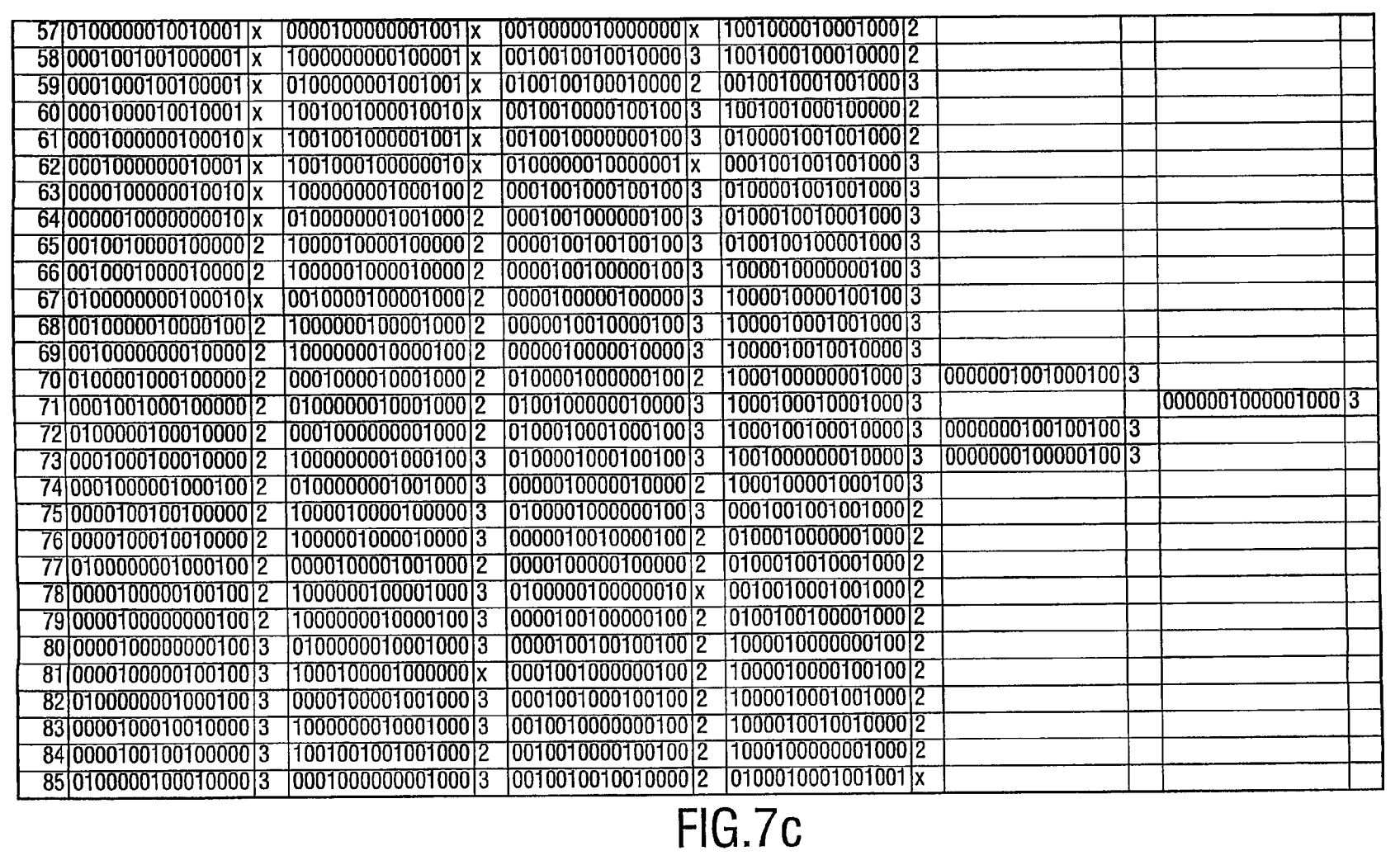
Figure 7D:
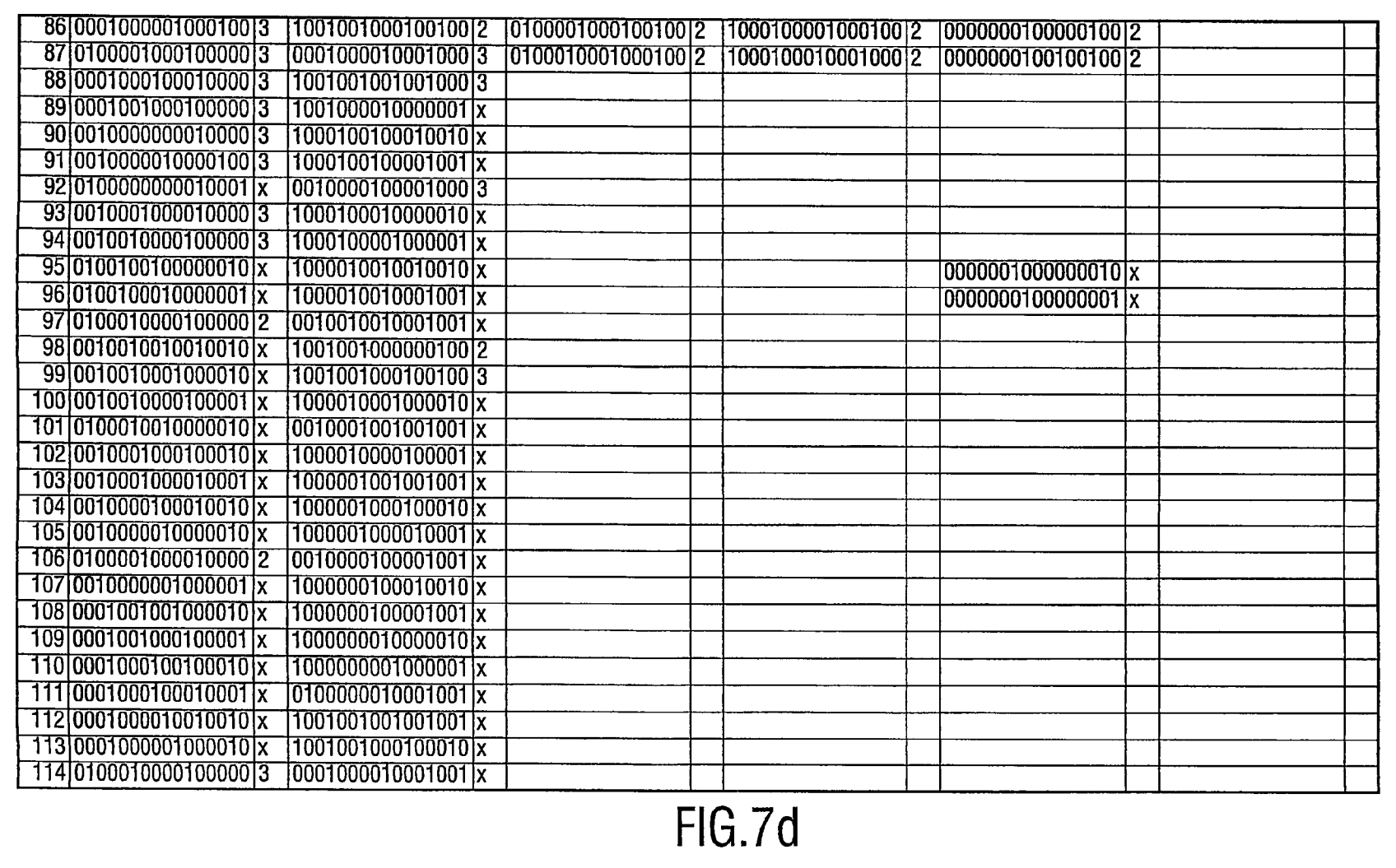
Figure 8A:
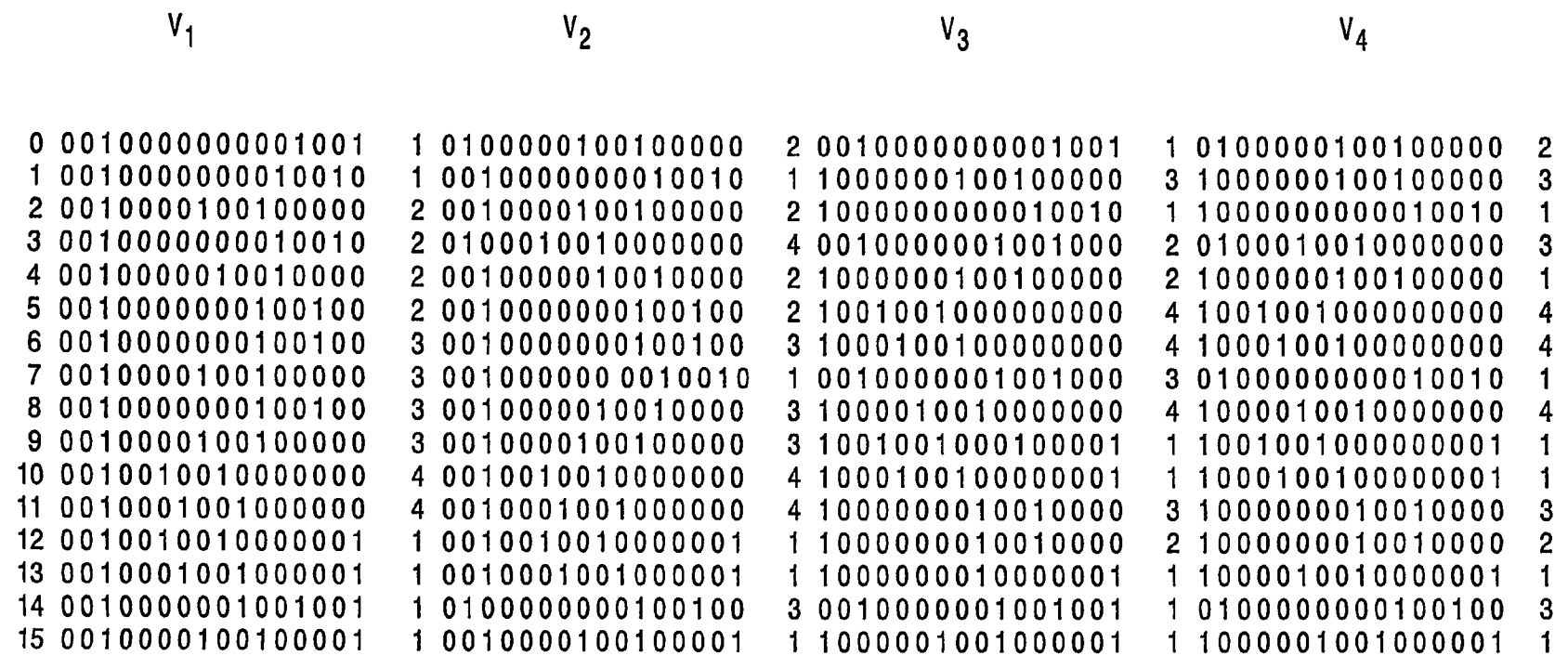
Figure 8B:
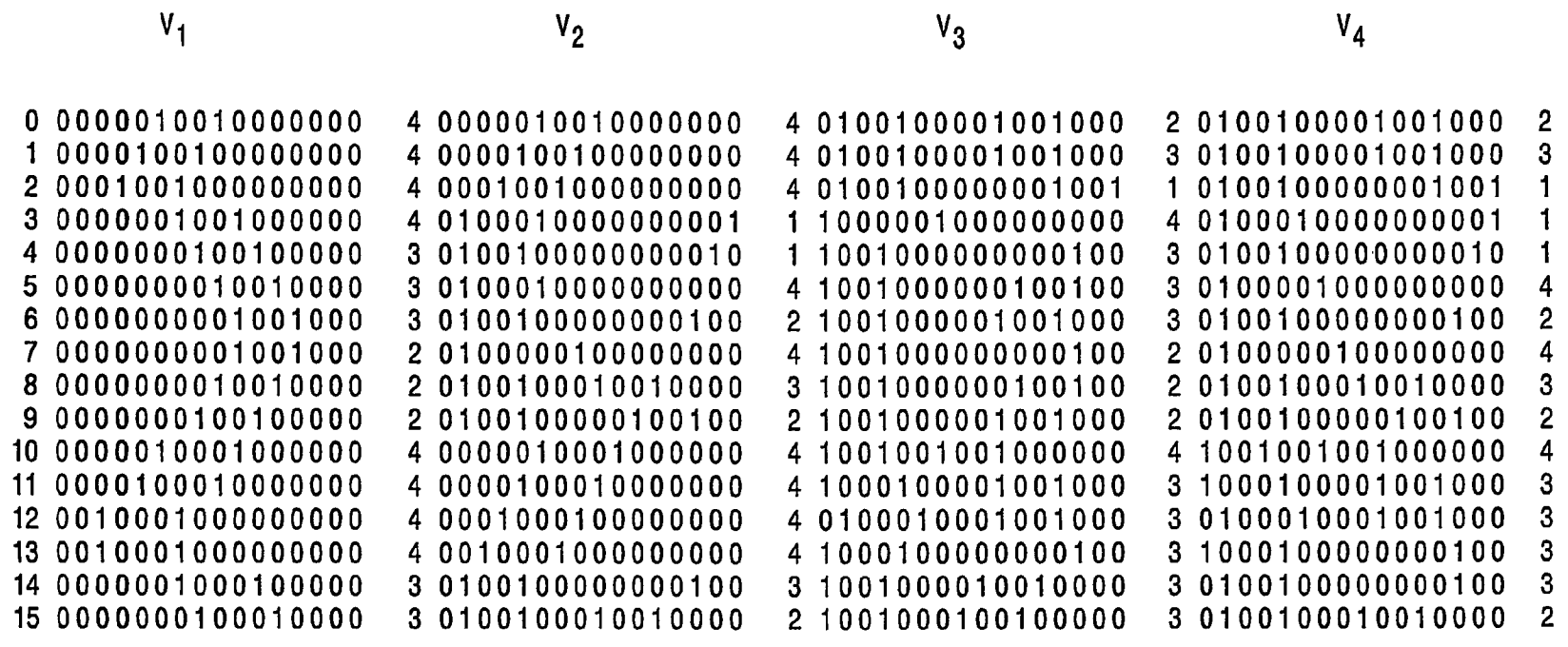
Figure 1:
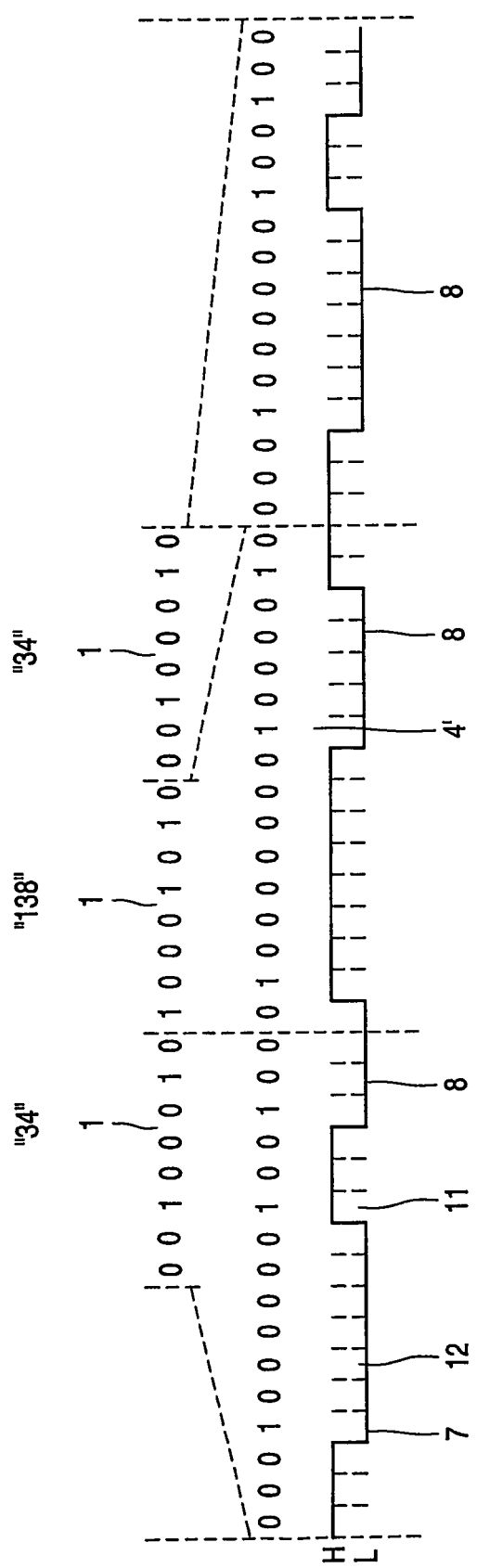

FIG. 7*a-i* shows tables which have subsets of code words for each of the information words; and FIG. 8*a-b* shows the first part of the tables for conventional EFM+ encoding.

In the Figures, elements which correspond to elements already described have the same reference numerals.

FIG. 1 shows three consecutive m-bit information words, in this case, 8-bit information words referenced 1. Information about coding methods can be found in the book by K. A. S. Immink, *Codes for Mass Data Storage Systems*, Shannon Foundation Publishers, Eindhoven, The Netherlands, 1999 (ISBN 90-74249-23-X) and the article by K. A. S. Immink, '*A Survey of Codes for Optical Disc Recording*', IEEE Journal on Selected Areas of Communications, Special issue on signal processing and coding for digital storage, vol. 19, pp. 751-764, April 2001. In said title, for example, the so-called EFM modulation system is described which is used for recording information on so-called Compact Discs and the EFM+ system used in DVD. The EFM-modulated signal is obtained by converting a series of 8-bit information words to a series of 14-bit code words, three merging bits being inserted into the code words. The code words are selected such that the minimum number of "0" bits situated between the "1" bits is d (2) and the maximum number is k (10). This constraint is also referenced dk-constraint. The series of code words is converted, via a modulo-2 integration operation, to a corresponding signal formed by bit cells having a high or low signal value, a "1"-bit being represented in the modulated signal by a change from the high to the low signal value or vice versa. A "0"-bit is represented by the lack of a change of signal value at a transition between two bit cells. The merging bits are selected such that even in the regions of transition between two code words the dk-constraint is satisfied and that in the corresponding signal the so-called running digital sum value remains substantially constant. The running digital sum value at a specific instant is understood to mean the difference between the number of bit cells having the high signal value and the number of bit cells having the low signal value, calculated over the modulated signal portion situated before this instant. A substantially constant running digital sum value means that the frequency spectrum of the signal does not comprise frequency components in the low frequency area. Such a signal is also referenced a DC-free signal. The lack of low-frequency components in the signal is highly advantageous when the signal is read from a record carrier on which the signal is recorded in the track, because then continuous tracking control unaffected by the recorded signal is possible. Information recording has a constant need for enhancing the information density on the record carrier. In FIG. 1 the three information words 1 have the respective word values "34", "138" and "34". This series of 3 information words 1 is converted to three consecutive n-bit code words, in this case, 16-bit code words referenced 4. The code words 4 form a bit string of bits having a logical "0" value and bits having a logical "1" value. The conversion of the information words is such that in the bit string the minimum number of bits having a logical "0" value positioned between two bits having a logical "1" value is d and the maximum is k, where d is equal to 2 and k is equal to 10. Such a bit string is often referenced a RLL string (RLL=Run Length Limited) with a dk-constraint. The individual bits of the code words will further be referenced x1, . . . , x16, where x1 denotes the first bit from the left, usually called the most significant bit, of the code word and x16 denotes the last bit of the code word.

The bit string formed by the code words 4 is converted to a modulated signal 7 by means of a modulo-2 integration operation. This modulated signal comprises three information signal portions 8 representing the code words 4. The information signal portions comprise bit cells 11 which may have a high signal value H or a low signal value L. The number of bit cells per information signal portion is equal to the number of bits of the associated code word. Each code word bit having a logical "1" value is indicated in the modulated signal 7 by a transition from a bit cell having the high signal value to a bit cell having the low signal value, or vice versa. Each code word bit having the logical "0" value is indicated in the modulated signal 7 by the absence of a change of signal value at a bit cell transition.

Furthermore, the frequency spectrum of the modulated signal 7 is required to include substantially no low-frequency components. Worded differently, the modulated signal 7 is to be substantially DC-free.

In the following an embodiment of the method according to the invention by which the modulated signal can be obtained will be described in detail.

The total set of code words is established as follows. First there is a requirement with respect to the code words that within the code words the dk-constraint is satisfied. The set of all the possible code words satisfying said dk-constraint is then divided into at least a group of a first type and at least a group of a second type. When a code word is delivered from one of the groups of the first type, a coding state S1 is established which exclusively depends on the group of the first type to which the delivered code word belongs. When one of the code words of the group of the second type is delivered, a coding state is established which depends both on the group of the second type and on the information word represented by the delivered code word. In en embodiment the group of code words of the first type referred to as G1 includes code words ending in a number a of bits having a logical "0" value, where the number a may be an integer equal to 0 or 1, or an integer smaller than or equal to 9 and greater than or equal to 6. The embodiment described here only has one group of the second type. This group comprises code words ending in a different number b of bits having a logical "0" value, which number b is an integer greater than or equal to 2 and smaller than or equal to 5. This group will henceforth be referenced group G2. In the example to be described here, two coding states i.e. S2 and S3 can be established by the combination of a code word and associated information word.

For each information word a subset of code words is established such that for each of the number of ending "0" bits a next code word is available so that the resulting sequence complies with the runlength constraint. Hence each subset has at least one code word having 0 or 1 zeroes at the start, and also at least one code word having at least 2 zeroes at the start. Further the subset has at least one code word for state S2 and at least one for state S3, which two code words are distinguishable based on a parameter which can be derived from the code word, e.g. the values of two bit positions both being zero or at least one being one. Hence for each information word at least one code word for S2 and at least one code word for S3 are available. Additional code words can be added to subsets, which can be used to comply with an additional criterion, e.g. the low frequency content of the signal. In an embodiment the additional code words are added for the subsets having code words with a high DC content, the added code words having an opposite DC content. In such case the low frequency content can be reduced by making a suitable selection from the subset of code words using the all code words which comply with the runlength constraint, i.e. for which the modulated signal of concatenated code words has only runlengths within the required dk range. In an embodiment the selection of code words from the subsets is used to encode further information of a low density, e.g. a watermark or copyright information. Such encoding may be also be combined with a reduction of the low frequency components in the modulated signal, in which case the reduction obviously will be somewhat less than in the case where the additional criterion is low frequency content only.

It is noted that dynamically choosing a code word that complies with the parameter value required by the state (needed only for a state of the second type) and with the dk constraint, i.e. using any of the code words from the subset that comply with the state and the runlength requirements, is more flexible than the conventional coding system based on a state machine approach, e.g. used in the EFM+ code for DVD, as described with reference to FIG. 8. The additional reduction of the LF components of the dynamic choosing compared to EFM+ is about 3 dB.

Figure 2:
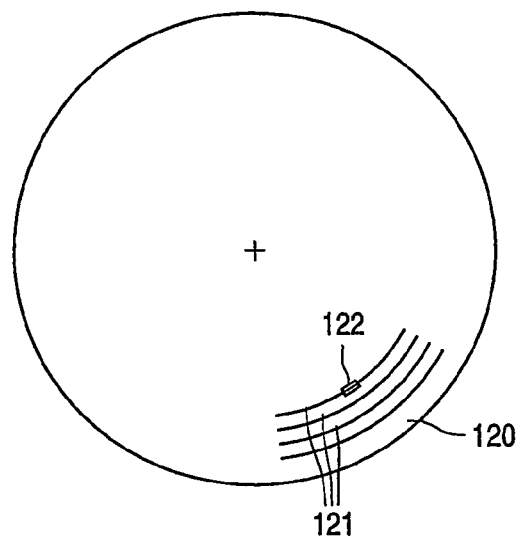
FIG. 2 shows a record carrier.

FIG. 2 shows by way of example, a record carrier 120 according to the invention. The record carrier shown is one of an optically detectable type. The record carrier may also be of a different type, for example, of a magnetically readable type. The record carrier comprises information patterns arranged in tracks 121.

Figure 3:
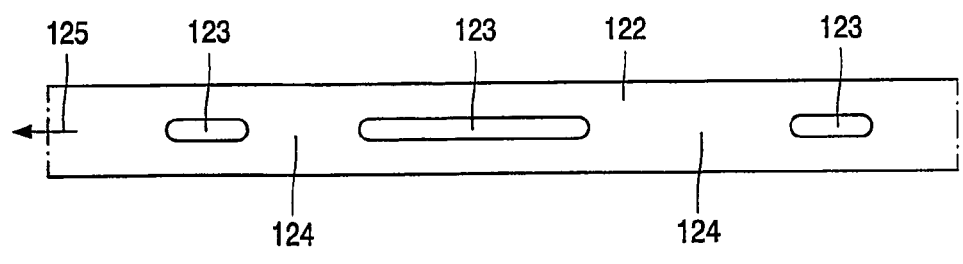
FIG. 3 shows an enlarged portion of the record carrier of FIG. 2.
Figure 3:

FIG. 3 shows a strongly enlarged portion 122 of one of the tracks 121. The information pattern in the track portion 121 shown in FIG. 3 comprises first sections 123, for example, in the form of optically detectable marks and second sections 124, for example, intermediate areas lying between the marks. The first and second sections alternate in a direction of the track 125. The first sections 123 present first detectable properties and the second sections 124 present second properties which are distinguishable from the first detectable properties. The first sections 123 represent bit cells 12 of the modulated binary signal 7 having one signal level, for example, the low signal level L. The second sections 124 represent bit cells 11 having the other signal level, for example, the high signal level H. The record carrier 12 may be obtained by first generating the modulated signal and then providing the record carrier with the information pattern. If the record carrier is of an optically detectable type, the record carrier can then be obtained with mastering and replica techniques known per se based on the modulated signal 7.

Figure 4:
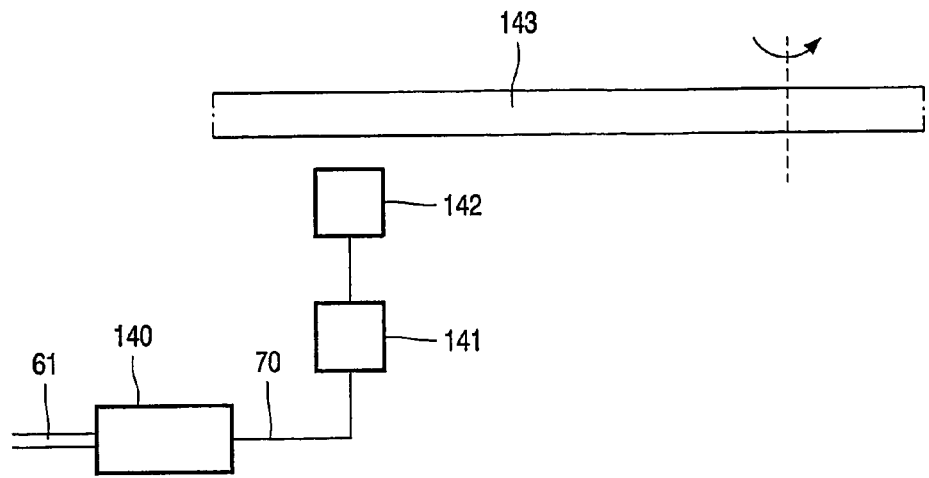
FIG. 4 shows a recording device.
Figure 6:
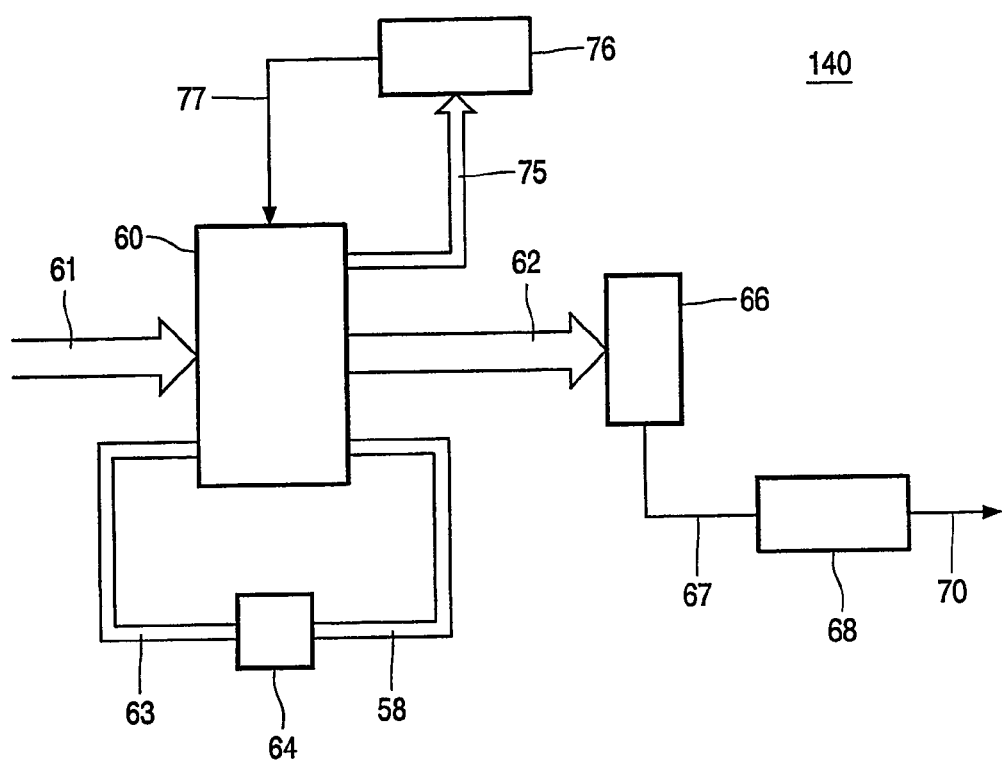
FIG. 6 shows a coding device.

FIG. 4 shows a recording device for recording information, in which the coding device according to the invention is used, for example, the coding device 140 shown in FIG. 6. In the recording device the signal line for delivering the modulated signal is connected to a control circuit 141 for a write head 142 along which a record carrier 143 of a writable type is moved. The write head 142 is of a customary type capable of introducing marks having detectable changes on the record carrier 143. The control circuit 141 may also be of a customary type generating a control signal for the write head in response to the modulated signal applied to the control circuit 141, so that the write head 142 introduces a pattern of marks that corresponds to the modulated signal.

Figure 5:
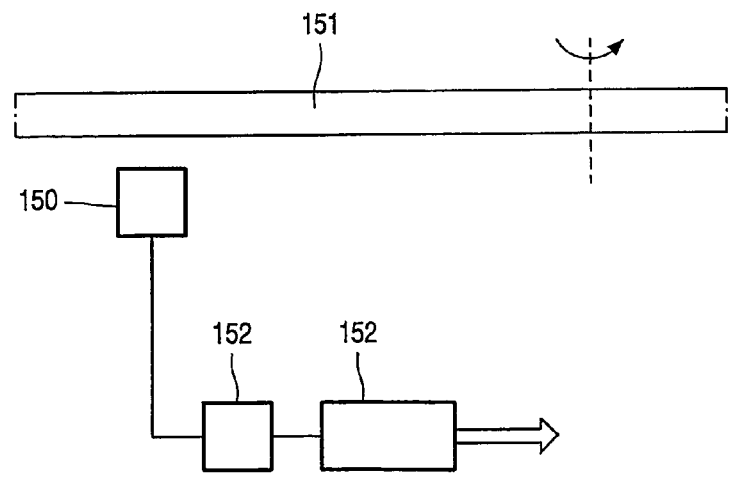
FIG. 5 shows a decoding and playback device.

FIG. 5 shows a reading device in which a decoding device according to the invention is used, for example, a decoding device 153 as described below. The reading device comprises a read head of a customary type for reading a record carrier according to the invention which record carrier carries an information pattern that corresponds to the modulated signal. The read head 150 then produces an analogue read signal modulated according to the information pattern read out by the read head 150. Detection circuit 152 converts this read signal in customary fashion to a binary signal which is applied to the decoding circuit 153.

An embodiment of the decoding device 153 consists of a logic array that implements the inverse of the coding function. The decoding device 153 includes a ROM memory as decoder, and/or a gate circuit for storing the subsets of code words for each information word as shown in FIG. 7. The received code words are compared with the stored code words, and the information word corresponding to the subset containing the received code word is send to the output. In the event that a code word is part of two subsets, the respective subset is selected by observing the 1st and 13th bit of the upcoming code word, which indicate the coding state of that upcoming code word of the second type S2 or S3. For each code word in the subsets a next coding state value is also stored, as indicated in FIG. 7. The applicable subset is determined by comparing the detected coding state with the stored states.

FIG. 6 shows an embodiment for a coding device 140 according to the invention by which the coding described above can be carried out. The coding device is arranged for converting the m-bit information words 1 to the n-bit code words 4 and the number of different coding states can be indicated by s bits. The coding device comprises a converter 60 for converting (m+s+x) binary input signals to (n+s+t) binary output signals. From the inputs of the converter m inputs are connected to a bus 61 for receiving m-bit information words. From the outputs of the converter n outputs are connected to a bus 62 for delivering n-bit code words. Furthermore, s inputs are connected to an s-bit bus 63 for receiving a state word denoting the current coding state. According to the embodiment of the coding described above the coding state can have the value S1, S2 or S3. A state word is delivered via the s-bit bus 63 by a buffer memory 64, for example, in the form of s flip-flops. The buffer memory 64 has s inputs connected to a bus 58 for receiving a state word to be stored in the buffer memory. For delivering the state words to be stored in the buffer memory the converter 60 has s outputs that are connected to bus 58. The converter 60 may comprise a ROM memory in which the code word tables shown in FIG. 7 are stored. The addresses in the ROM are determined by the combination of state word and information word applied to the inputs of the converter, while also in response to a selection signal 77, the addresses of the memory locations are selected. In a different embodiment the state words are derived by a gate circuit.

In a first operation the converter 60 selects a subset of code words corresponding to the present information word on bus 61. Secondly words of the subset are selected that comply with the state on s-bit bus 63 and the predefined criterion, e.g. the runlength constraint dk, for the modulated signal as follows. If the coding state is of the first type, all code words of the subset are selected, but if the coding sate is of the second type, like S2 or S3, only code words complying with the required parameter, e.g. the bit values at positions x1 and x13, for that state are selected. Further only code words complying with the runlength constraints are selected by calculating the runlengths occurring in the sequence of code words at the boundary between the preceding and the current code word. After the selection one or more code words are available for encoding the present information word. The converter applies to a bus 75 information of all selected code words in the subset. The bus 75 is connected to a selection circuit 76 for applying an additional criterion to the selection of the code word from the subset. In an embodiment the parameter is the low frequency content. The parameter evaluated in selection circuit 76 then denotes for each of the selected code words the change of the digital sum value caused by that code word. The selection circuit 76 calculates a running DSV for a portion of the modulated signal. This portion may start at an arbitrary point in the past or at a sync word. In another embodiment the DSV may also be calculated for a future portion, but in that case a memory is needed for temporarily storing the possible sequences of code words. Based on this information the selection circuit 76 delivers a selection signal of x bits which indicates which one of the code words selected from the subset of the current information word is to be fed to the bus 62. This selection signal is applied to the converter 60 over a selection signal line 77.

It is noted that a sync pattern can be added to the modulated signal regularly. The definition of a unique and reliable pattern can be the sync pattern as used in the DVD system, or the sync patterns in the coding system described in U.S. Pat. No. 5,696,505.

Finally bus 62 is connected to the parallel inputs of a parallel-to-serial converter 66 which converts code words 4 received over bus 62 to a serial bit string to be supplied over a signal line 67 to a modulator circuit 68 which converts the bit string to the modulated signal 7 to be delivered over signal line 70. The modulator circuit 68 may be one of a customary type, for example, a so-termed modulo-2 integrator.

In an embodiment the decoding device 153 as described with FIG. 5 includes a demodulator for retrieving information encoded in the selection of the code words. The demodulator comprises a selection circuit similar to the selection circuit 76 in the coding device 140. The selection circuit reconstructs a sequence of code words based on the information words retrieved. The demodulator compares the sequence of code words as received and the reconstructed sequence. From the differences additional information is decoded. The additional information may be a watermark or copyright information.

FIG. 7 shows a coding table according to the invention; subdivided in parts in FIGS. 7a-7i. In the first column marked "Data" the information words 0-255 are listed. In each data row in the even columns up to 5 possible code words are listed, constituting a subset of code words for the information word in that row. The second, sixth and tenth columns are marked "S2", and contain code words usable when the coding state is S2. The code words comply with the parameter value for this state, i.e. having a zero value on bit positions x1 and x13. The fourth, eighth and twelfth columns are marked "S3" and contain code words usable when the coding state is S3. The code words comply with the parameter value for this state, i.e. having a non-zero value on bit positions x1 or x13. When the coding state is S1 code words from all columns can be used. In the odd columns marked "NS" the next state is indicated for the corresponding code word given left of that value. A next state 2 indicates that the following code word must be taken from a column marked S2, and next state 3 indicates that the following code word must be taken from a column marked S3. A next state x indicates the coding state of the first type S1; and x indicates that the following code word may be taken from any of the columns. As explained above the sequence of code words must also comply with a predefined criterion, i.e. runlength constraints of a minimum number of zeroes d=2 and a maximum number of zeroes k=10. Hence only code words are selected that when combined constitute a sequence having such only allowed runlengths. Further the final selection of the code word is based on an additional criterion, i.e. reducing the low frequency content or a further modulation of low frequency components.

FIG. 8 shows part of a coding table for the conventional EFM+ code, as fully described in U.S. Pat. No. 5,790,056. The rate is 8/16, so m=8 and n=16, the dk constraints are d =2, k=10. A main and a substitute table are used, and FIG. 8*a* shows the first part of the main coding table and FIG. 8*b* shows a first part of the substitute table for the information words 0-87. The code words are selected based on a conventional state machine approach as described below. The code words of the substitute table may be selected for DC control. When the information words are converted to code words, a code word belonging to a set of code words depending on one of the coding states S1,S2, DS3 or See information word to be converted. The sets of code words belonging to the coding states S1, S2, S3 and S4 will henceforth be referenced V1, V2, V3 and V4, respectively. The code words in the sets are selected such that each bit string that can be formed by a code word from the group that has established a coding state and an arbitrary code word from the set established by this coding state satisfies the dk-constraint. In the case where the coding state S4 is established by the delivery of the previously delivered code word and the coding state thus denotes that the previous code word ends in a bit string having a logical "0" value greater than or equal to 6 and smaller than or equal to 9, code word set V4 which is established by the coding state S4 is only allowed to comprise code words beginning with a maximum of 1 bit having the logical "0" value. It is noted that code words beginning with a larger number of bits having the logical "0" value would result in transitional areas between the previously delivered code word and the code word to be delivered, in which areas the number of successive bits having the logical "0" value will not always be smaller than or equal to 10 and thus not satisfy the dk-constraint. For similar reasons, set V1 comprises only code words beginning with a number of bits having the logical "0" value that is greater than or equal to 2 and smaller than or equal to 9.

Sets V2 and V3 of code words belonging to the coding states S2 and S3 contain only code words beginning with a number of bits having a logical "0" value greater than or equal to 0 and smaller than or equal to 5. The code words satisfying this condition are spread over the two sets V2 and V3, so that sets V2 and V3 do not contain any common code words at all. Sets V2 and V3 will be referenced disjunct sets in the following. The spreading of the code words over sets V2 and V3 is preferably such that on the basis of the logical values of a limited number of p bits there can be determined to what set a code word belong. In the example described above, the bit combination x1.x13 is used for this purpose. Code words from set V2 are recognisable from the bit combination x1.x13=0.0. Code words from set V3 are then recognisable from the combination x1.x13 which is unequal to 0.0. A distinction is made between code words establishing coding state S1 (group G11) on delivery, code words establishing coding state S2 or S3 (group G2) on delivery, and code words establishing the coding state S4 (group G12) on delivery. Set V1 comprises 138 code words from group G11, 96 code words from group G2 and 22 code words from group G12. It will be evident that the number of different code words in set V1 is smaller than the number of different 8-bit information words.

Since the code words from group G2 are always followed by a code word from set V2 or a code word from set V3, and, in addition, based on the code word following a code word from group G2 there may be established what set this code word belongs to, a code word from group G2 followed by a code word from set V2 can be unequivocally distinguished from the same code word from group G2, but followed by a code word from set V3. Worded differently, when code words are assigned to an information word, each code word from group G2 can be used twice. Each code word from group G2 together with a random code word from set V2 forms a unique bit combination which is inseparable from the bit combination formed by the same code word and a random code word from the same set V3. This means that 138 unique bit combinations (code words) from group G11 can be used for set V1, 22 unique bit combinations (code words) from group G12 and 2*96 unique bit combinations (code words from group G2 combined with subsequent code words) from group G2. This brings the total number of useful unique bit combinations to 352. The number of unique bit combinations formed with the code words from sets V2, V3 and V4 are 352, 351 and 415, respectively.

Although the invention has been explained by embodiments using code words from the EFM+ code, any other suitable set of code words and runlength constraints may be used. Also for the record carrier an optical disc has been described, but other media, such as a magnetic disc or tape, may be used. It is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' may be represented by the same item of hardware. Further, the scope of the invention is not limited to the embodiments, and the invention lies in each and every novel feature or combination of features described above.

The invention claimed is:

1. A method of converting a series of m-bit information words to a modulated signal, m being an integer, said method comprising the steps of:

converting each received information word into a corresponding n-bit code word, n being an integer exceeding m; and modulating the corresponding code words to form the modulated signal, wherein the converting step converts the series of information words to a series of corresponding code words so that the corresponding modulated signal satisfies a predetermined criterion, and wherein the corresponding code words are spread over at least a group of a first type and at least a group of a second type, while a code word belonging to the group of the first type establishes a coding state of a first type determined by the associated group, and a code word belonging to the group of the second type establishes one of r coding states of a second type determined by the associated group and by the information word (1) associated to the delivered code word, in which the group of the second type comprises at least one code word being associated with at most r information words among which the respective information word is distinguishable by evaluating a predetermined parameter of the following code word, characterized in that said step of converting each information word comprises the sub-steps:

providing each information word with an associated subset of code words comprising at least r code words mutually differing in the value of the predetermined parameter; and selecting the corresponding code word based on an additional criterion from the subset of code words excluding all code words not complying with said predetermined criterion and, in the event that a coding state of the second type has been established by the preceding code word, excluding all code words having a value of the predetermined parameter not corresponding to the established coding state of the second type.

2. The method as claimed in claim 1, wherein the additional criterion is controlling a low frequency content of the modulated signal.

3. The method as claimed in claim 2, wherein a running digital sum value is established as a measure for the low frequency content, said running digital sum value being determined over a portion of the modulated signal and denotes, for this portion, the current value of a difference between the number of bit cells having a first signal value and the number of bit cells having a second signal value, while said selection of the code word is made so as to constrain the digital sum value.

4. The method as claimed in claim 1, wherein the value of the predetermined parameter is the logical value of p predetermined bits.

5. The method as claimed in claim 4, wherein the p predetermined bits are the first and thirteenth bit position.

6. The method as claimed in claim 1, wherein the additional criterion is encoding further information.

7. The method as claimed in claim 1, wherein the modulated signal satisfies as the predetermined criterion that each number of successive bit cells having a same signal value is at least d+1 and at most k+1.

8. The method as claimed in claim 7, wherein d is equal to 2 and k is equal to 10.

9. The method as claimed in claim 1, wherein m is equal to 8 and n is equal to 16.

10. The method as claimed in claim 1, wherein a record carrier is produced by providing a substrate with an information pattern representing the modulated signal.

11. A device comprising:

an m-to-n bit converter for converting the m-bit information words to nbit code words;

means for modulating the n-bit code words to a modulated signal, the modulated signal satisfying a predetermined criterion; and state establishing means for establishing, on the delivery of a code word by the converter, a coding state of a first type for each of the delivered code words belonging to a group of a first type determined by the associated group, and one of r coding states a second type for each of the delivered code words belonging to a group of the second type determined by the associated group and by the information word associated to the delivered code word, in which the group of the second type comprises at least one code word being associated with at most r information words among which the respective information word is distinguishable by evaluating a predetermined parameter of the following code word, characterized in that the M-to-n-bit converter comprises:

means for providing, for each information word, an associated subset of code words comprising at least r second type of code words mutually differing in a predetermined way; and means for selecting a code word based on an additional criterion from the subset of code words excluding all code words not complying with said predetermined criterion and, in the event that a coding state of the second type has been established by the preceding code word, excluding all code words having a value of the predetermined parameter not corresponding to the established coding state of the second type.

12. The coding device as claimed in claim 11, wherein the coding device further comprises:

means for recording information on a record carrier by recording an information pattern representing the modulated signal.

13. A signal comprising a sequence of successive signal portions each corresponding to an information word, the signal satisfying a predetermined criterion, in which each of the signal portions comprises n bit cells having a first or second signal value, a signal portion belonging to a group of a first type of signal portions uniquely representing an information word, and a signal portion belonging to a group of a second type of signal portions in combination with a successive signal portion representing a unique information word, at least one signal portion of the group of the second type being associated with at most r information words among which the respective information word is distinguishable by evaluating a predetermined parameter of the successive signal portion, characterized in that the signal comprises at least one signal portion selected based on an additional criterion from a subset of signal portions excluding all signal portions not complying with said predetermined criterion and, in the event that the preceding signal portion belongs to the group of the second type, excluding all signal portions having a value of the predetermined parameter not being associated with the respective information word, and the subset being associated to an information word and comprising at least r signal portions mutually differing in the value of the predetermined parameter.

14. The signal as claimed in claim 13, wherein the additional criterion is a low frequency content of the modulated signal.

15. The signal as claimed in claim 13, wherein the predetermined parameter is the logical value of p predetermined bits.

16. A record carrier on which a signal as claimed in claim 13 is provided in a track in which information patterns represent the signal portions, said information patterns comprising first and second parts alternating in the direction of the track, the first parts presenting detectable first properties and the second parts presenting second properties distinguishable from the first properties, and the parts having the first properties representing bit cells having the first signal value, and the parts having the second properties representing the bit cells having the second signal value.

17. A rendering device comprising:

means for reading information from a track on a record carrier;

means for scanning the track;

demodulation means for retrieving code words from signal portions of a signal provided in the track, the signal satisfying a predetermined criterion, in which each of the signal portions comprises n bit cells having a first or second signal value, a signal portion belonging to a group of a first type of signal portions uniquely representing an information word, and a signal portion belonging to a group of a second type of signal portions in combination with a successive signal portion representing a unique information word; and a converter for converting the code words into information words, the converter comprising means for distinguishing the respective information word by evaluating a predetermined parameter of the following code word, characterized in that the converter comprises means for converting a code word selected from a subset of code words, the subset being associated to the information word and comprising at least r code words mutually differing in the value of the predetermined parameter.

18. The rendering device as claimed in claim 17, wherein the converter comprises means for detecting an additional criterion from the selection of the code word from the subset.

* * * * *